United States Patent
Thakur et al.

(10) Patent No.: US 7,683,668 B1
(45) Date of Patent: Mar. 23, 2010

(54) LEVEL SHIFTER

(75) Inventors: Krishna Thakur, Greater Noida (IN); Deependra K Jain, Jabalpur (IN); Raghav Mehta, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/264,924

(22) Filed: Nov. 5, 2008

(51) Int. Cl.
*H03K 19/094* (2006.01)
(52) U.S. Cl. .............................. 326/68; 326/81; 326/83
(58) Field of Classification Search .................... 326/68, 326/80–83, 86–87; 327/333
See application file for complete search history.

(56) References Cited

U.S. PATENT DOCUMENTS

| | | | |
|---|---|---|---|
| 6,054,875 A * | 4/2000 | Wayner | 326/83 |
| 6,489,828 B1 | 12/2002 | Wang et al. | |
| 6,556,061 B1 | 4/2003 | Chen et al. | |
| 6,600,679 B2 | 7/2003 | Tanzawa et al. | |
| 6,842,043 B1 | 1/2005 | Nguyen et al. | |
| 6,954,100 B2 | 10/2005 | Dharne et al. | |
| 7,061,299 B2 | 6/2006 | Khan et al. | |
| 7,183,817 B2 | 2/2007 | Sanchez et al. | |
| 7,268,588 B2 | 9/2007 | Sanchez et al. | |
| 2003/0001655 A1 | 1/2003 | Jeong | |
| 2003/0098711 A1 | 5/2003 | Tsuboi et al. | |
| 2003/0112041 A1 | 6/2003 | Clark et al. | |
| 2003/0117207 A1 | 6/2003 | Suk et al. | |
| 2005/0057296 A1 | 3/2005 | Dharne et al. | |
| 2007/0063734 A1* | 3/2007 | Huang | 326/81 |
| 2008/0036522 A1* | 2/2008 | Chung et al. | 327/333 |

OTHER PUBLICATIONS

Kyoung-Hoi Koo; Jin-Ho Seo; Myeong-Lyong Ko; Jae-Whui Kim; Mixed Signal Core P/T, Design Technology R&D Team, Samsung Electronics, A new level-up shifter for high speed and wide range interface in ultra deep sub-micron,Circuits and Systems, 2005. ISCAS 2005. IEEE International Symposium May 23-26, 2005 pp. 1063-1065 vol. 2, South Korea.

Wen-Tai Wang, Ming-Dou Ker, Mi-Chang Chiang,Chung-Hui Chen Lab. of Integrted Circuits & Syst., Nat. Chiao Tung Univ., Level shifters for high-speed 1 V to 3.3 V interfaces in a 0.13μm Cu-interconnection/low-k CMOS technology, VLSI Technology, Systems, and Applications, 2001. Proceedings of Technical Papers. 2001 International Symposium, 2001, pp. 307-310, Taiwan.

\* cited by examiner

*Primary Examiner*—Vibol Tan
*Assistant Examiner*—Jany Tran
(74) *Attorney, Agent, or Firm*—Charles Bergere

(57) ABSTRACT

A level shifter (10) includes a first transistor (12) having a gate configured to receive a first input signal, and a second transistor (14) having a gate configured to receive a second input signal. A first feedback circuit is connected to drains of the first transistor (12) and the second transistor (14). A second feedback circuit is connected to the first feedback circuit.

17 Claims, 1 Drawing Sheet

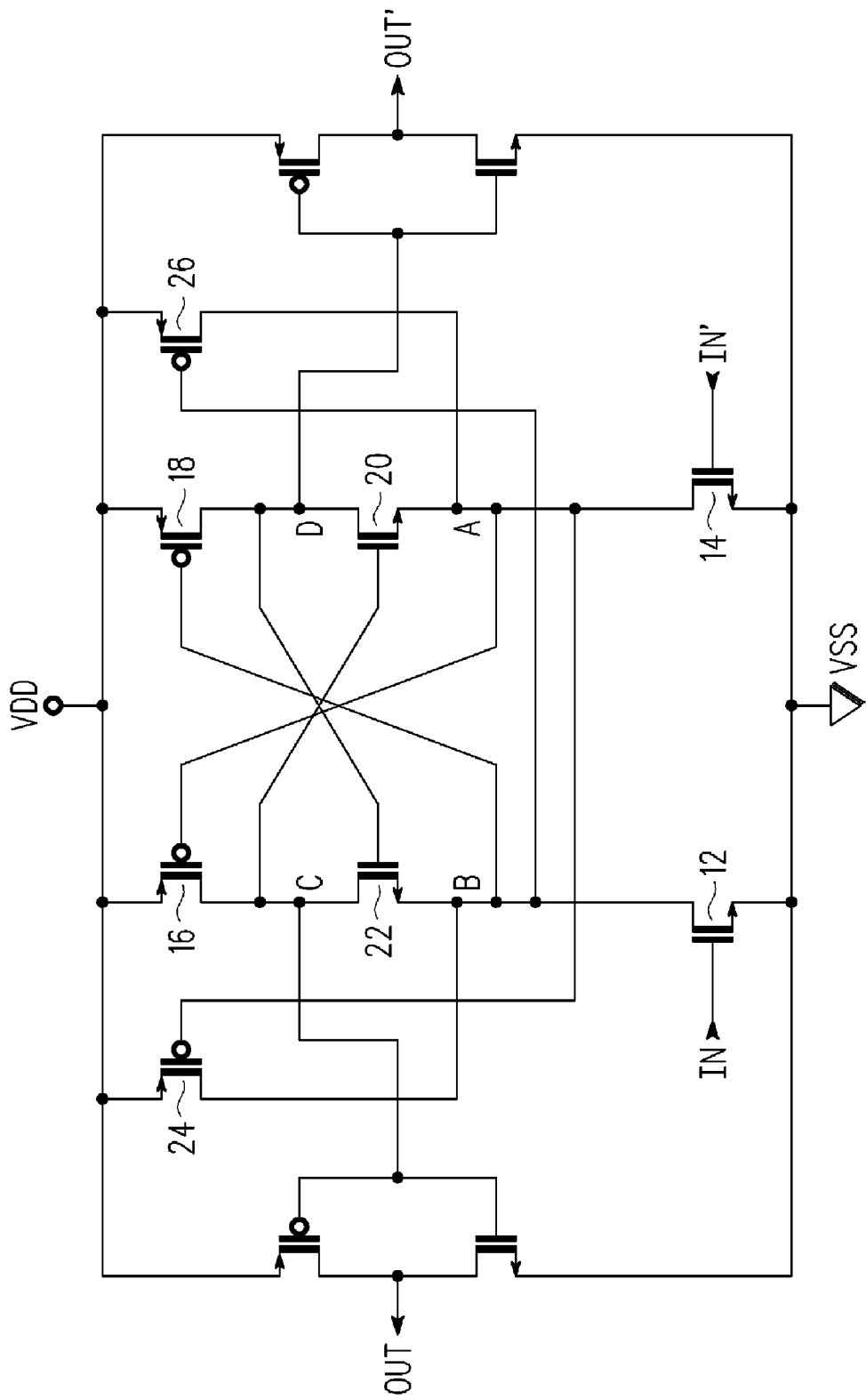
FIGURE

LEVEL SHIFTER

BACKGROUND OF THE INVENTION

The present invention relates generally to digital logic circuits and more particularly to level shifting circuits for shifting digital signals between two different voltage levels.

Level shifting circuits for translating or converting the voltage of a digital signal from one voltage level to a higher or lower voltage level are known. However, conventional level shifters have difficulty operating at speeds greater than 200 megahertz (MHz). The problem becomes more severe when digital signals are to be level shifted between 1.0 volt (V) and 3.3 V at such speeds.

One conventional way of achieving higher operating speeds is by increasing the size of a device, thereby producing a stronger device that generates a higher switching current. However, there is a threshold beyond which further increases in device size no longer translate into increases in the speed of the level shifter. Furthermore, undesirable parasitic capacitance increases with increasing device size.

Another conventional way of achieving higher operating speeds is by using devices with low threshold voltages ($V_t$), typically less than 300 millivolt (mV). However, the use of low threshold voltage devices imposes additional constraints on a level shifter such as, for example, the requirement for protection circuitry. Protection circuitry increases circuit complexity and design overhead and slows the level shifter down.

Hence, there is a need for a level shifter circuit that is operable at speeds greater than 200 MHz.

BRIEF DESCRIPTION OF THE DRAWINGS

The following detailed description of a preferred embodiment of the invention will be better understood when read in conjunction with the appended drawing. The present invention is illustrated by way of example and is not limited by the accompanying FIGURE.

The FIGURE is a schematic circuit diagram illustrating a level-up shifter in accordance with an exemplary embodiment of the present invention.

DETAILED DESCRIPTION OF THE INVENTION

The detailed description set forth below in connection with the appended drawing is intended as a description of the presently preferred embodiment of the invention, and is not intended to represent the only form in which the present invention may be practiced. It is to be understood that the same or equivalent functions may be accomplished by different embodiments that are intended to be encompassed within the spirit and scope of the invention.

For convenience, terms that have been used in the description of the exemplary embodiment are given below. It is to be noted that these meanings are provided merely to aid the understanding of the description, and are in no way to be construed as limiting the scope of the invention.

The term "reset voltage" is the least voltage at which a circuit operates. Reset voltage may be provided to a circuit using a negative voltage (<0V) source or a ground voltage (0V) source.

The term "low voltage digital signal" is a digital signal in which a LOW logic value substantially corresponds to a reset or reference voltage and a HIGH logic value corresponds to a low power supply voltage.

The term "high voltage digital signal" is a digital signal in which a LOW logic value substantially corresponds to the reset or reference voltage and a HIGH logic value corresponds to a high power supply voltage.

As an example of the application of these meanings, it is assumed that the low power supply voltage has a value of 1.0 V, the high power supply voltage may have a value of 3.6 V and the reset or reference voltage may be 0 V. A logic HIGH level for the low voltage digital signal may have a value of about 1.0 V, while that for logic LOW may have a value of about 0 V. Similarly, for the high voltage digital signal, logic HIGH may have a value of about 3.6 V, while logic LOW may have a value of about 0 V.

The present invention is directed to a level shifter including a first transistor having a gate configured to receive a first input signal, and a second transistor having a gate configured to receive a second input signal. A first feedback circuit is connected to drains of the first transistor and the second transistor. A second feedback circuit is connected to the first feedback circuit. As is understood by those of skill in the art, each of the transistors includes a source, a drain and a gate. The transistors may also include a bulk terminal. Unless noted otherwise, the bulk terminal is connected to the source.

The present invention is also directed to a level shifter including a first N-channel transistor having a gate configured to receive a first input signal, and a second N-channel transistor having a gate configured to receive a second input signal. A gate of the first P-channel transistor is connected to a drain of the second N-channel transistor and a gate of the second P-channel transistor is connected to a drain of the first N-channel transistor. A gate of a third N-channel transistor is connected to a drain of the first P-channel transistor, and a gate of a fourth N-channel transistor is connected to a drain of the second P-channel transistor.

The level shifter of the present invention has several advantages. In particular, through the use of two positive feedback loops working in tandem, the speed at which the level shifter operates is enhanced. Additionally, as the level shifter is capable of operating at high frequencies, distortions in the duty cycle may be reduced.

Referring now to the FIGURE, a schematic circuit diagram of a level-up shifter 10 in accordance with an exemplary embodiment of the present invention is shown. The level-up shifter 10 operates to shift a low voltage digital signal to a high voltage digital signal.

The level-up shifter 10 includes a first N-channel transistor 12, a second N-channel transistor 14, a first feedback circuit comprising a first P-channel transistor 16 and a second P-channel transistor 18, a second feedback circuit comprising a third N-channel transistor 20 and a fourth N-channel transistor 22, and a pull-up circuit comprising a third P-channel transistor 24 and a fourth P-channel transistor 26. Each of the transistors 12, 14, 16, 18, 20, 22, 24 and 26 includes a source, a drain and a gate.

An input signal IN is received at the gate of the first N-channel transistor 12 and an inverted input signal IN' is received at the gate of the second N-channel transistor 14. The sources of the first N-channel transistor 12 and the second N-channel transistor 14 are connected to a first voltage supply line VSS. In the present embodiment, the first voltage supply line VSS provides a reset or reference voltage to the level-up shifter 10. In one embodiment, the first voltage supply line VSS may be connected to a negative voltage (<0V) source or a ground voltage (0V) source.

The first and second transistors 16 and 18 of the first feedback circuit are connected between a second voltage supply line VDD and the drains of the first and second N-channel transistors 12 and 14. More particularly, the sources of the first P-channel transistor 16 and the second P-channel transistor 18 are connected to the second voltage supply line VDD, the gate of the first P-channel transistor 16 is connected to the drain of the second N-channel transistor 14 at a node A and the gate of the second P-channel transistor 18 is connected to the drain of the first N-channel transistor 12 at a node B. In the present embodiment, the second voltage supply line VDD provides a high power supply voltage to the level-up shifter 10.

The second feedback circuit is connected to the first feedback circuit. More particularly, the gate of the third N-channel transistor 20 is connected to the drain of the first P-channel transistor 16 at a first output node C and the gate of the fourth N-channel transistor 22 is connected to the drain of the second P-channel transistor 18 at a second output node D. In the present embodiment, the source of the third N-channel transistor 20 is connected to the drain of the second N-channel transistor 14 at the node A and the drain of the third N-channel transistor 20 is connected to the gate of the fourth N-channel transistor 22 at the second output node D. Similarly, the source of the fourth N-channel transistor 22 is connected to the drain of the first N-channel transistor 12 at the node B and the drain of the fourth N-channel transistor 22 is connected to the gate of the third N-channel transistor 20 at the first output node C.

An output signal of the level-up shifter 10 is generated at the first and second output nodes C and D. An inverter circuit may be connected to each of the first and second output nodes C and D for logic level restoration.

The pull-up circuit is connected between the second voltage supply line VDD and the drains of the first N-channel transistor 12 and the second N-channel transistor 14. More particularly, the sources of the third P-channel transistor 24 and the fourth P-channel transistor 26 are connected to the second voltage supply line VDD, the gate of the third P-channel transistor 24 is connected to the drain of the second N-channel transistor 14 at node A and the gate of the fourth P-channel transistor 26 is connected to the drain of the first N-channel transistor 12 at node B. The pull-up circuit prevents the occurrence of floating nodes in the level-up shifter circuit 10, particularly when the level-up shifter 10 is operated at slower speeds of, for example, less than 100 megahertz (MHz). Static current in the level-up shifter circuit 10 can thus be reduced.

In the present embodiment, each of the transistors 12, 14, 16, 18, 20, 22, 24 and 26 in the level-up shifter 10 is tolerant to high voltage differentials between its terminals, for example, each of the transistors 12, 14, 16, 18, 20, 22, 24 and 26 in the level-up shifter 10 may be of a double gate oxide (DGO) structure and/or may have a threshold voltage ($V_t$) of greater than 500 millivolts (mV). Advantageously, the use of only high tolerance devices can obviate the need for protection circuitry. Additionally, the layout of the level-up shifter circuit 10 may be more compact as only the same type of device is used, preferably metal-oxide-semiconductor field-effect transistors (MOSFETs). Consequent to the foregoing, the level-up shifter 10 may be of very low-area design. In some embodiments, the level-up shifter circuit 10 of the present invention may occupy about half the area of a conventional level-up shifter circuit with a similar specification. For example, a level-up shifter 10 of the present invention operating at a frequency of 300 megahertz (MHz) may occupy an area of about 14 microns (µm) by about 13 µm.

As there is no DC current consumption between the first voltage supply line VSS and the second voltage supply line VDD, there may be no static current dissipation and power may be only consumed by the level-up shifter circuit 10 during a switching operation.

The operation of the level-up shifter 10 is described hereinafter.

If the input signal IN, which is a low voltage digital signal, is logic HIGH (i.e., the input signal IN has a value close to the low power supply voltage), the first N-channel transistor 12 is turned on. Consequently, the voltage at the drain of the first N-channel transistor 12 is pulled down to the reset or reference voltage. As a result, the second P-channel transistor 18 is turned on, pulling the voltage at the second output node D up to the high power supply voltage VDD. The fourth N-channel transistor 22 is subsequently turned on and as a result, the voltage at the drain of the fourth N-channel transistor 22 is pulled down to the reset or reference voltage VSS. Consequently, the third N-channel transistor 20 is turned off, cutting off a discharge path for the second output node D.

Since both the first N-channel transistor 12 and the fourth N-channel transistor 22 are turned on concurrently, the speed at which the first output node C discharges is increased. Furthermore, since the third N-channel transistor 20 is turned off, there is no path for the second output node D to discharge. Consequently, the speed at which the second output node D charges is increased. In this way, the first and second feedback circuits work cooperatively or in tandem to enhance the speed of the level-up shifter 10. Thus, in some embodiments, the level-up shifter 10 may be operated at a speed of greater than 200 MHz. For example, frequencies of between about 300 MHz and about 500 MHz for level shifting a digital signal from about 1.0 volt (V) to about 3.3 V may be achievable in some embodiments.

Furthermore, when the first N-channel transistor 12 is turned on, the voltage at the node B is low and the fourth P-channel transistor 26 is turned on. Consequently, the voltage at the node A is pulled up to the high power supply voltage level VDD. Advantageously, this prevents the node B from floating when the level-up shifter 10 is operated at slower speeds of, for example, less than 100 MHz and both the second N-channel transistor 14 and the third N-channel transistor 20 are turned off.

The level-up shifter 10 is capable of shifting a low voltage digital signal of between about 0.9 volts (V) and 1.1 V to a high voltage digital signal of between about 3.0 V and about 3.6 V in a single step.

Although the FIGURE shows only two (2) feedback loops, it will be understood that more than two feedback loops may be employed in the level shifter of the present invention.

The description of the preferred embodiment of the present invention has been presented for purposes of illustration and description, but is not intended to be exhaustive or to limit the invention to the form disclosed. It will be appreciated by those skilled in the art that changes could be made to the embodiment described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A level shifter for shifting a low voltage digital input signal to a high voltage digital output signal, comprising:
  a first transistor having a gate configured to receive a first low voltage digital input signal;
  a second transistor having a gate configured to receive a second low voltage digital input signal;

a first feedback circuit connected to drains of the first transistor and the second transistor, wherein the first feedback circuit comprises,
  a third transistor having a gate connected to a drain of the second transistor at a first node; and
  a fourth transistor having a gate connected to a drain of the first transistor at a second node; and
a second feedback circuit connected to the first feedback circuit, wherein the second feedback circuit comprises,
  a fifth transistor having a gate connected to a drain of the third transistor at a third node; and
  a sixth transistor having a gate connected to a drain of the fourth transistor at a fourth node, wherein a first high voltage digital output signal is generated at the third node and a second high voltage digital output signal is generated at the fourth node; and
wherein the first, second, fifth and sixth transistors are of a first category of transistors, and the third and fourth transistors are of a second category of transistors, and wherein the first and second categories of transistors are different.

2. The level shifter of claim 1, further comprising a pull-up circuit connected to the drains of the first transistor and the second transistor.

3. The level shifter of claim 2, wherein the pull-up circuit comprises:
  a seventh transistor having a gate connected to the drain of the second transistor at the first node; and
  an eighth transistor having a gate connected to the drain of the first transistor at the second node.

4. The level shifter of claim 3, further comprising a first voltage supply line connected to sources of the first transistor and the second transistor.

5. The level shifter of claim 4, further comprising a second voltage supply line connected to sources of the third transistor, the fourth transistor, the seventh transistor and the eighth transistor.

6. The level shifter of claim 5, wherein the first voltage supply line comprises a low voltage supply and the second voltage supply line comprises a high voltage supply.

7. The level shifter of claim 3, wherein the seventh transistor and the eighth transistor are of the second category of transistors, and wherein the first and second categories of transistors are different.

8. The level shifter of claim 7, wherein the first category of transistors are N-channel transistors and the second category of transistors are P-channel transistors.

9. The level shifter of claim 1, wherein the first category of transistors are N-channel transistors and the second category of transistors are P-channel transistors.

10. The level shifter of claim 1, wherein each of the transistors in the level shifter is of a double gate oxide (DGO) structure.

11. The level shifter of claim 1, wherein each of the transistors in the level shifter has a threshold voltage of greater than 500 millivolts (mV).

12. A level shifter for converting a low voltage digital input signal to a high voltage digital output signal, comprising:
  a first N-channel transistor having a gate configured to receive a first low voltage digital input signal;
  a second N-channel transistor having a gate configured to receive a second low voltage digital input signal, wherein the first and second low voltage digital input signals are complementary;
  a first P-channel transistor having a gate connected to a drain of the second N-channel transistor at a first node;
  a second P-channel transistor having a gate connected to a drain of the first N-channel transistor at a second node;
  a third N-channel transistor having a gate connected to a drain of the first P-channel transistor at a third node; and
  a fourth N-channel transistor having a gate connected to a drain of the second P-channel transistor at a fourth node, wherein a first high voltage digital output signal is generated at the third node and a second high voltage digital output signal is generated at the fourth node and wherein the first and second high voltage digital output signals are complementary.

13. The level shifter of claim 12, further comprising:
  a third P-channel transistor having a gate connected to the drain of the second N-channel transistor at the first node; and
  a fourth P-channel transistor having a gate connected to the drain of the first N-channel transistor at the second node.

14. The level shifter of claim 13, further comprising a first voltage supply line connected to the sources of the first N-channel transistor and the second N-channel transistor.

15. The level shifter of claim 14, further comprising a second voltage supply line connected to the sources of the first P-channel transistor, the second P-channel transistor, the third P-channel transistor and the fourth P-channel transistor.

16. The level shifter of claim 12, wherein each of the transistors in the level shifter is of a double gate oxide (DGO) structure.

17. The level shifter of claim 12, wherein each of the transistors in the level shifter has a threshold voltage of greater than 500 millivolts (mV).

* * * * *